United States Patent [19]

Miyazaki et al.

[11] Patent Number: 5,078,831
[45] Date of Patent: Jan. 7, 1992

[54] METHOD OF MAKING MULTILAYER PRINTED WIRING BOARD

[76] Inventors: Masafumi Miyazaki, 34-6, Hasunuma-cho, Itabashi-ku, Tokyo; Teruhisa Tanabe, 1-18-8, Motobuto, Urawa-shi, Saitama-ken; Yoshiharu Tomura, Tokusan-so 102, 7-27-3, Takashimadaira, Itabashi-ku, Tokyo, all of Japan

[21] Appl. No.: 581,763

[22] Filed: Sep. 13, 1990

[30] Foreign Application Priority Data

Mar. 30, 1990 [JP] Japan ..................... 2-80875

[51] Int. Cl.⁵ .................... B44C 1/22; C23F 1/02
[52] U.S. Cl. .................... 156/630; 156/634; 156/656; 156/659.1; 156/666; 156/902; 427/96
[58] Field of Search ............ 156/630, 634, 656, 659.1, 156/666, 901, 902; 174/68.1, 250, 256, 258; 427/96, 98

[56] References Cited

U.S. PATENT DOCUMENTS

| | | |
|---|---|---|
| 2,739,881 | 3/1956 | Kepple ................. 427/96 X |
| 2,778,762 | 1/1957 | Eisler ................. 427/96 X |
| 3,330,695 | 7/1967 | Curran ................. 427/96 X |
| 4,643,798 | 2/1987 | Takada et al. ................. 156/630 |
| 4,720,394 | 1/1988 | Kojima et al. ................. 427/96 X |
| 4,994,302 | 2/1991 | Kellerman ................. 427/96 |

*Primary Examiner*—William A. Powell
*Attorney, Agent, or Firm*—Hidaka and Benman

[57] ABSTRACT

A multilayer printed wiring board and a method of manufacturing the board are provided. The board has a printed wiring incorporating metal powder consisting of fine grains and a layer of insulation material which is adhesive when uncured. The fine grains of the metal powder are securely fixed to the layer of insulation material so as to strengthen the bond between the printed wiring and the layer of insulation material. Alternatively, the layer of insulation material incorporates a layer of glass powder to enhance the insulation thereof. In this case, the layer of glass powder is made by evenly spreading glass powder on a first coat of uncured adhesive insulation material. The layer of glass powder is covered by a second coat of insulation material after the first coat of insulation material is cured so that the layer of glass powder is sandwiched between the two coats of insulation material. The metal powder is evenly spread on a layer of insulation material or the second coat of insulation material while the insulation material is uncured and adhesive. After the insulation material is cured, the surface of the insulation material covered with metal powder is copper-plated and is etched to form a printed wiring incorporating the metal powder.

12 Claims, 6 Drawing Sheets

FIG. 1(B')
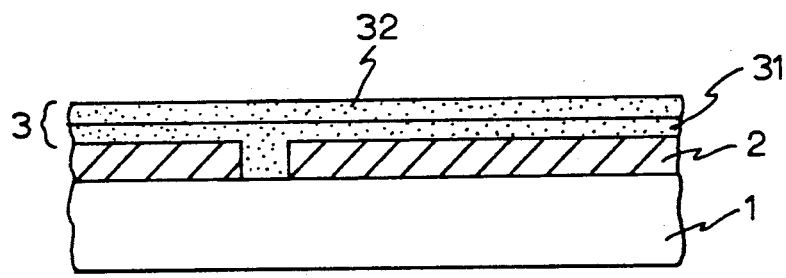
FIG. 1(C')
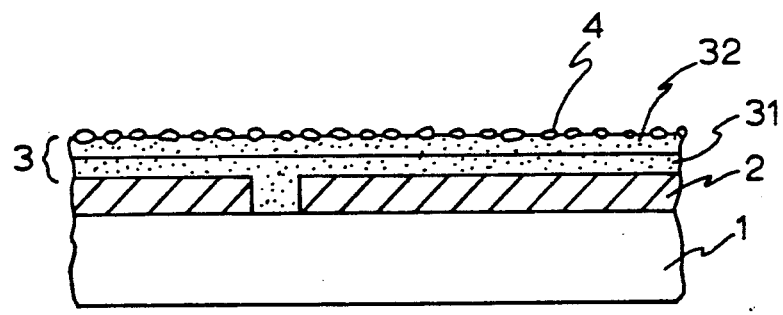

METHOD OF MAKING MULTILAYER PRINTED WIRING BOARD

BACKGROUND OF THE INVENTION

1. Field of the Invention

This invention pertains to an improved multilayer printed wiring board, which is used for mounting and connecting electrical or electronics components, and a method of making the multilayer printed wiring board.

2. Description of the Prior Art

Multilayer printed wiring boards have generally been used in order to achieve high density packagings of electrical or electronics wirings. A typical conventional multilayer printed wiring board assembly employs a plurality of base board in a laminated form. Each of the base board has thereon a printed wiring of a predetermined pattern. Between two adjoining base boards with respective printed wirings are interposed adhesive insulation material (prepreg). Layers of base boards, printed wirings and adhesive insulation material are put together by being machine-pressed so as to adhere to one another to form a printed wiring board assembly. Through-holes are made in the board assembly at predetermined positions and the holes are copper-plated so that the individual layers of the printed wirings may be electrically interconnected.

When a press is used to fablicate a multilayer printed wiring board assembly as described above, the base boards are liable to shrink and warp because the boards are subjected to a high temperature during each pressing process. In order to prevent the boards from warping, a work margin of at least 60 mm must be added to each side of the boards. Such work margins are, however, nothing but substantial waste areas of the boards. Furthermore, the required number of pressing steps increases with the number of layers. For example, a six-layer board assembly would require two pressing steps and an eight-layer board assembly three pressing steps. Since the base boards are liable to shrink in each pressing step, as the number of layers increases the dimensional accuracy of the fablicated board assembly tends to be degraded. As a consequence, a limitation must exist in the number of layers which can practically be used for a board assembly.

In addition, the cost saving in such a conventional method of fablication is not an easy task because the press is expensive, a number of manufacturing steps, including preparatory steps, are required before the pressing step, and a substantial space for the press in addition to the work area has to be maintained.

The method of making a multilayer printed wiring board as described below has so far been proposed in order to solve the above described problems. Referring to FIG. 3, a base board 11 and a first layer printed wiring 12 are made from a copper-clad board in a conventional manner. Epoxy resin is applied to cover the first layer wiring 12 to form a first layer of epoxy resin 13 by means, for example, of a silk screening printing. Then, copper plating is applied onto the epoxy resin 13 to make a copper foil layer 14, which is subsequently made into a second layer printed wiring. Next, though not shown in the figure, epoxy resin is again applied to cover the second layer printed wiring in the same manner as described above. The same step is repeated for a desired number of layers. By making through-holes at predetermined positions of the board before the last copper plating is performed, indivisual layers of the printed wirings are electrically interconnected and the multilayer printed wiring board is completed.

The preceding manufacturing method of a multilayer printed wiring board requires neither pressing steps nor a spacious work area including the space required for a press. The work margins of the board, which is a waste, can be minimized and the number of layers can easily be increased as required. Thus, a substantial cost saving can be achieved.

However, a disadvantage still pertains to this manufacturing method. Namely, the bond between the layer of epoxy resin 13 and the copper foil layer 14 is not necessarily satisfactory and, therefore, the printed wiring is liable to peel off the epoxy resin.

Referring to FIG. 4, one idea to prevent such a peel-off problem of the wiring is that the surface of the epoxy resin layer 13 is finished rough so as to have numerous fine scratches 13a by means of brushing or sandblasting before the surface is copper-plated. However, because each of the fine scratches 13a tapers off toward its bottom as shown in FIG. 4, the bonding strength between the epoxy resin 13 and the copper foil layer 14 can not sufficiently be enhanced A part of the plated copper can separate from the epoxy resin 13 also because of the pressure which may build up in the epoxy resin 13 when the moisture contained therein evaporates.

An idea of applying an electrically conductive paste onto the epoxy resin in order to make a wiring layer, instead of plating with copper, would lack practicality because such conductive paste would not provide a sufficient electrical conductivity and, therefore, problems tend to entail.

SUMMARY OF THE INVENTION

In view of the above, the primary object of the present invention is to provide a multilayer printed wiring board which has a strong bond between the printed wirings and the respective layers of insulation material and a method of making the board.

Another object of the present invention is to provide a reliable multilayer printed wiring board efficiently and economically.

The following is a summary of the present invention for accomplishing the foregoing objects.

After an uncured adhesive insulation material is applied onto a base board having a first printed wiring thereon to form an insulation layer of the insulation material, metal powder consisting of fine grains is evenly spread on the layer of the insulation material while the insulation material is uncured and adhesive so that the metal powder adheres to the surface of the layer. Upon the insulation material is cured, an insulation layer whose surface is evenly covered with the metal powder is formed. Then, the surface of the insulation layer covered with the metal powder is copper-plated to form a copper foil on the insulation layer. The copper foil is etched to form a second printed wiring on the insulation layer. The insulation material may repeatedly be applied onto the second printed wiring, and by repeating the foregoing process, a multilayer printed wiring board assembly having a desired number of printed wirings may be produced.

The uncured adhesive insulation material may be applied in two separate steps so as to make the insulation layer having a first coat and a second coat. To form the second coat, the insulation material is applied onto the first coat after the first coat is cured.

Alternatively, the layer of the insulation material incorporates a layer of glass powder to enhance the insulation thereof. In this case, the layer of glass powder is made by evenly spreading glass powder on the first coat of the insulation material while the insulation material is uncured and adhesive. Then, the layer of glass powder is covered by a second coat of insulation material after the first coat of insulation material is cured so that the layer of glass powder is sandwiched between the two coats of insulation material.

The metal powder is evenly spread on a layer of insulation material or the second coat of insulation material while the second coat of the insulation material is uncured and adhesive. After the insulation material is cured, the surface of insulation material covered with metal powder is copper-plated and is etched to form a second printed wiring incorporating the metal powder, in the same manner as is described above.

Since the insulation layer is covered with metal powder consisting of fine grains securely adhering to the surface of the layer and the fine grains are integrated into the copper plated on the layer, the copper foil, or, consequently, the second printed wiring, is strongly bonded to the layer. Such strong bond eliminates the possibility of separation of the copper foil, or the printed wiring, from the insulation layer even by the pressure caused by the evaporation of the moisture contained in the insulation layer.

Furthermore, since no mechanical pressing step is employed in the manufacturing process according to the present invention, the number of total manufacturing steps can be minimized and, therefore, shrinkage or warping of the products can be avoided. Thus, multilayer printed wiring boards with high accuracies and without copper separation problems can be produced easily, efficiently and economically.

BRIEF DESCRIPTION OF THE DRAWINGS

FIGS. 1(B') and 1 (C') are sectional views showing a variation of the manufacturing steps shown in FIGS. 1(B) and 1(C).

DESCRIPTION OF THE PREFERRED EMBODIMENTS

The first embodiment of the present invention will now be described.

FIGS. 1(A) to 1(E) are sectional views showing a multilayer printed wiring board in a sequence of manufacturing steps according to the first embodiment of the present invention.

Figure 1A:
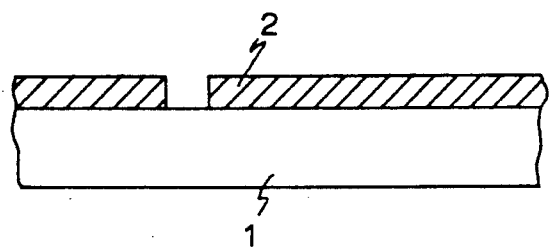
FIGS. 1(A), 1(B), 1(C), 1(D) and 1(E) are sectional views of a multilayer printed wiring board shown in a sequence of the manufacturing steps according to the first embodiment of the present invention.

Referring to FIG. 1(A), numeral 1 denotes a glass epoxy resin board. Numeral 2 denotes a first patterned printed wiring which is made from a copper foil, originally plated on the epoxy glass resin board 1, by a conventional photolithography and copper etching method.

Figure 1B:
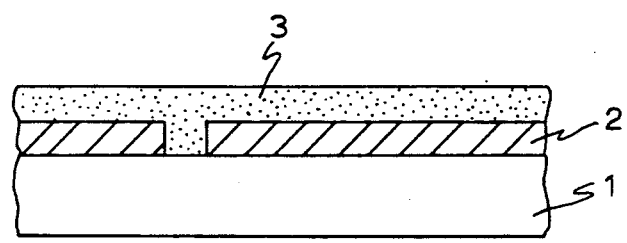

Referring to FIG. 1(B), numeral 3 denotes a layer of epoxy resin. The layer 3 of epoxy resin is formed by evenly applying uncured adhesive epoxy resin by a screen printing method onto the entire surface of the glass epoxy resin board 1 covering the first patterned printed wiring 2.

Figure 1C:
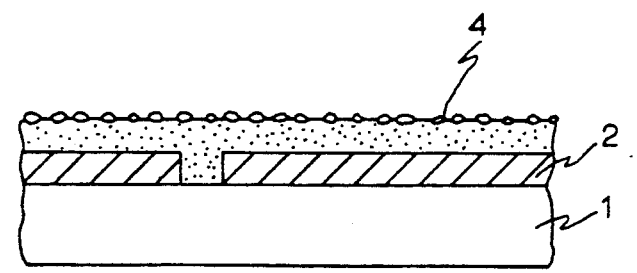

Referring to FIG. 1(C), numeral 4 denotes copper powder consisting of fine grains. Immediately after the layer 3 of uncured adhesive epoxy resin has been formed, the copper powder 4 is evenly spread on the layer 3 in such a manner that little space is left among the fine grains of the copper powder 4 while the epoxy resin of the layer 3 is uncured and adhesive. Practically, an ample quantity of the copper powder 4 is first placed on the layer 3 of epoxy resin covering all of the surface area thereof, and then the board 1 is turned substantially upside down and lightly tapped or otherwise agitated so that the fine grains of the copper powder which have not adhered to the adhesive epoxy resin, namely an excess quantity of the grains of the copper powder, are shaked and dropped off the surface of the layer 3 of the adhesive epoxy resin.

Next, the adhesive epoxy resin of the layer 3 is cured so that the copper powder 4 having remained on the surface of the layer 3 may be securely fixed to the layer 3. In this embodiment, the cure was promoted in an oven under the temperature of 140° C. for 30 minutes.

Alternatively, in order to ensure the insulation of the layer 3, the uncured adhesive epoxy resin may be applied to the surface of the glass epoxy resin board 1, covering the patterned printed wiring 2, in two separate steps for two coatings.

Referring to FIG. 1(B'), numeral 31 denotes a first coat of epoxy resin and numeral 32 denotes a second coat of epoxy resin. The first coat and the second coat of epoxy resin integrally constitute the layer 3.

First, a first lot of uncured adhesive epoxy resin is applied onto the surface of the glass epoxy resin board 1 by a screen printing method so as to evenly cover the first printed wiring 2 with the epoxy resin to form a first coat of epoxy resin 31 on the first printed wiring 2. After the first coat of the epoxy resin is cured, a second lot of uncured adhesive epoxy resin is applied onto the first coat of epoxy resin 31 so as to evenly cover the first coat of epoxy resin 31 to form a second coat of epoxy resin 32 on the first coat of epoxy resin 31 by the same screen printing method. Then, referring to FIG. 1(C'), the copper powder 4 is evenly spread on the surface of the second coat of epoxy resin 32 in such a manner that little space is left among the fine grains of the copper powder 4 while the second lot of epoxy resin is uncured and adhesive. The manner in which the copper powder is spread on the second coat of epoxy resin 32, and an excess quantity of the copper powder is shaked off, is the same as mentioned above. Consequently, the fine grains of the copper powder 4 adhere to the surface of the second coat of epoxy resin 32. Then, the second lot of epoxy resin is cured so that the copper powder is securely fixed to the surface of the second coat of epoxy resin, whereby a rigid layer of the copper powder is formed on the second coat of epoxy resin. In this alternative case, each of the two separate curings for the two coats of epoxy resin were promoted in an oven under the temperature of 140° C. for 30 minutes.

Figure 1D:
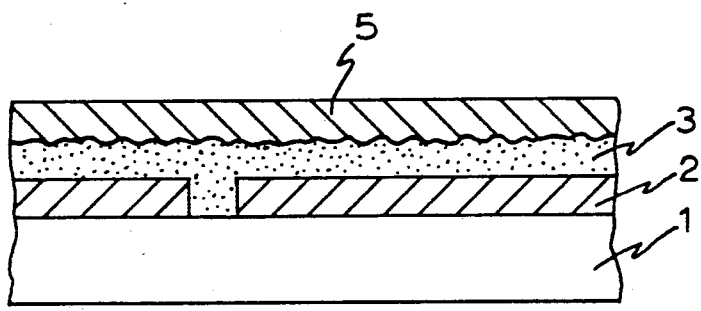
Figure 1E:
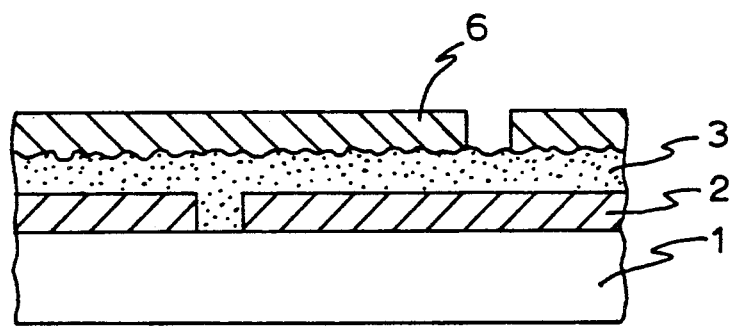

Then, using copper sulfate, the surface of the layer 3, being covered with the copper powder 4, is copper-plated to form a copper foil layer 5 as shown in FIG. 1(D). The thickness of the copper foil layer 5 in this embodiment is 30 μm. This copper foil layer 5 is etched according to a predetermined pattern by a conventional etching method including steps such as photolithography etc. so as to form a second patterned printed wiring 6 as shown in FIG. 1(E). Thus, a two-layer printed wiring board is now produced.

Although not illustrated, the uncured adhesive epoxy resin may further be applied onto the second patterned printed wiring 6 to form an additional layer of epoxy resin thereon, and repeating the same steps as described above, a multilayer printed wiring board having three or more layers of patterned printed wirings can be produced.

The second embodiment of the present invention will now be described. The second embodiment is an improved version of the multilayer printed wiring board described in the first embodiment having an enhanced insulation between printed wirings of different layers.

FIGS. 2(A) to 2(F) are sectional views showing a multilayer printed wiring board in a sequence of manufacturing steps according to the second embodiment of the present invention.

Figure 2A:
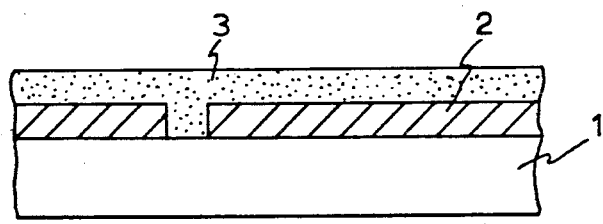
FIGS. 2(A) to 2(F) are sectional views of a multilayer printed wiring board shown in a sequence of the manufacturing steps according to the second embodiment of the present invention.

Referring to FIG. 2(A), numeral 1 denotes a glass epoxy resin board. Numeral 2 denotes a first patterned printed wiring which is made from a copper foil, originally plated on the epoxy glass resin board 1, by a conventional copper etching method.

Figure 2B:
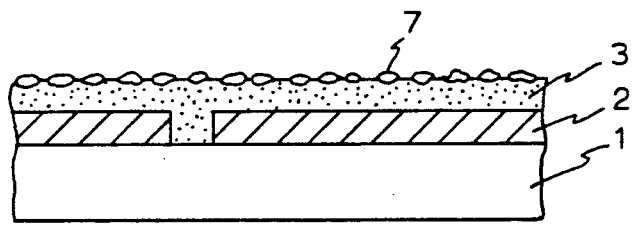

Referring to FIG. 2(B), numeral 3 denotes a first coat of epoxy resin. The first coat 3 of epoxy resin is formed by evenly applying uncured adhesive epoxy resin by a screen printing method onto the entire surface of the glass epoxy resin board 1 covering the first patterned printed wiring 2 in the same manner as in the case of the first embodiment.

Still referring to FIG. 2(B), numeral 7 denotes glass powder consisting of fine grains. The glass powder 7 is evenly spread on the first coat 3 in such a manner that little space is left among the fine grains of the glass powder 7 while the first coat 3 of epoxy resin is uncured and adhesive. Practically, an ample quantity of the glass powder 7 is first placed on the first coat 3 of epoxy resin covering all of the surface area thereof, and then the board 1 is turned substantially upside down and lightly tapped or otherwise agitated so that the fine grains of the glass powder which have not adhered to the first coat 3 of adhesive epoxy resin, namely the excess grains, are shaked and dropped off the surface of the first coat 3 of adhesive epoxy resin. Thus, a layer of glass powder is formed on the first coat 3 of epoxy resin. The grain size of the glass powder 7 used in this second embodiment was 100 mesh.

Next, the adhesive epoxy resin of the first coat 3 is cured so that the glass powder 7 having remained on the surface of the first coat 3 may be securely fixed to the first coat 3. In this embodiment, the cure was promoted by baking the first coat 3 in an oven under the temperature of 140° C. for 30 minutes.

Figure 2C:
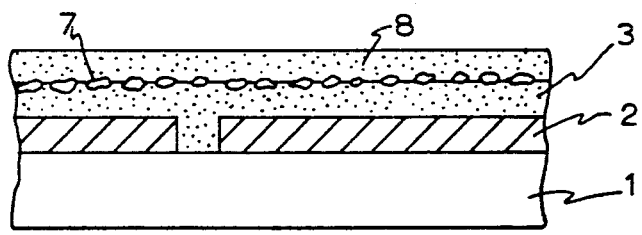

Referring to FIG. 2(C), numeral 8 denotes a second coat of epoxy resin. The second coat 8 of epoxy resin is formed by evenly applying uncured adhesive epoxy resin by the screen printing method onto the entire area of the layer of glass powder 7. Thus, the layer of glass powder 7 is sandwiched between the first coat 3 of epoxy resin and the second coat 8 of epoxy resin. In other words, there is formed a layer of epoxy resin incorporating the first coat 3 of epoxy resin, the layer of glass powder 7 and the second coat 8 of epoxy resin.

Figure 2D:
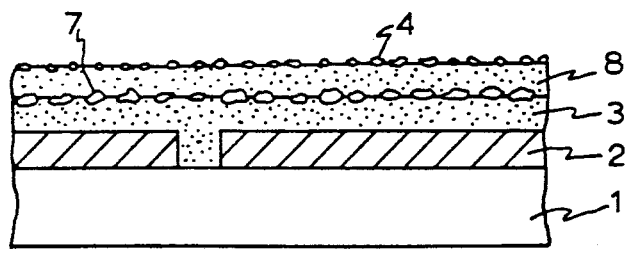

Referring to FIG. 2(D), numeral 4 denotes copper powder consisting of fine grains. The copper powder 4 is evenly spread on the second coat 8 of epoxy resin in such a manner that little space is left among the fine grains of the copper powder 4 while the epoxy resin of the second coat 8 is uncured and adhesive. Practically, an ample quantity of the copper powder 4 is first placed on the second coat 8 of epoxy resin covering all of the surface area thereof, and then the board 1 is turned substantially upside down and lightly tapped or otherwise agitated so that the fine grains of the copper powder which have not adhered to the adhesive epoxy resin, namely the excess grains of the copper powder, are shaked and dropped off the surface of the second coat 8 of adhesive epoxy resin.

Next, the adhesive epoxy resin of the second coat 3 is cured so that the copper powder 4 may be securely fixed to the second coat 8. As in the case for the first coat 3, the cure was promoted by baking the second coat 8 in an oven under 140° C. for 30 minutes.

Figure 2E:
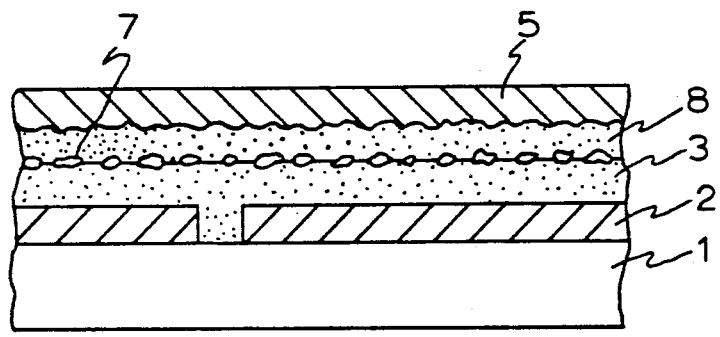
Figure 2F:
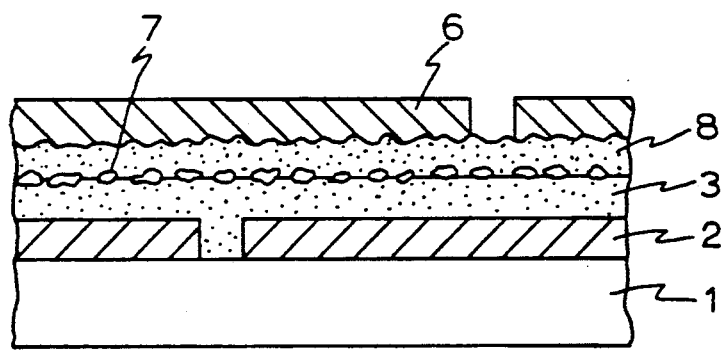
Figure 3:
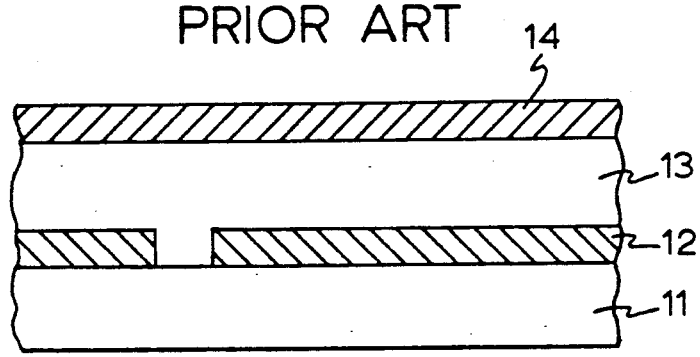
FIG. 3 is a sectional view showing a multilayer printed wiring board being manufactured in a prior art method.
Figure 4:
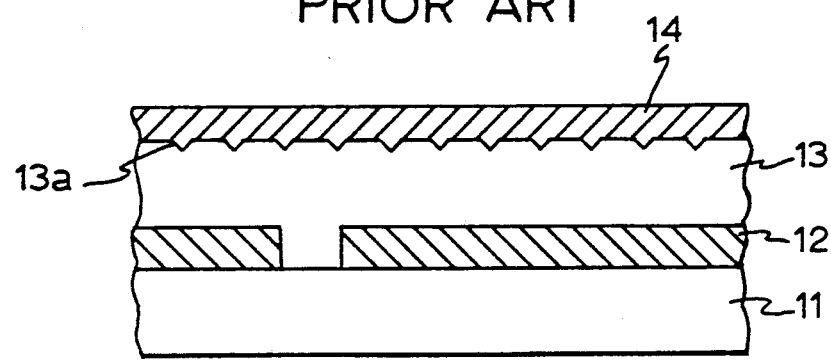
FIG. 4 is a sectional view showing a multilayer printed wiring board being manufactured in another prior art method.

Then, using copper sulfate, the surface of the second coat 8, being covered with the copper powder 4, is copper-plated to form a copper foil layer 5 as shown in FIG. 2(E). The thickness of the copper foil layer 5 in this embodiment is 30 μm. This copper foil layer 5 is etched according a predetermined pattern by a conventional etching method including steps of photolithography etc. so as to form a second patterned printed wiring 6 as shown in FIG. 2(F). Thus, a two-layer printed wiring board is produced.

Although not illustrated, the adhesive epoxy resin may further be applied onto the second patterned printed wiring 6 to form an additional layer of adhesive epoxy resin thereon, and repeating the same steps described above, a multilayer printed wiring board having three or more layers of patterned printed wiring can be produced.

In addition to the insulating effect of the adhesive epoxy resin, which by itself is an electrically insulating material, since each layer of epoxy resin in the second embodiment contains a layer of glass powder, the electrical insulation between any two layers of patterned printed wiring is further substantially strengthened.

The following descriptions commonly apply to both the first embodiment and the second embodiment.

In the copper-plating process to form the copper foil, the fine grains of the copper powder 4 act as kernels for the copper plating. The copper foil is formed in such a manner that the copper foil is integrated with the fine grains of the copper powder 4 which act as kernels of the copper foil and are securely fixed to the layer of epoxy resin. Therefore, the copper foil, consequently, the patterned printed wiring 6, is strongly bonded to the layer of epoxy resin. Such strong bond positively prevents the patterned printed wiring 6 from separating from the surface of the layer of epoxy resin even when the moisture contained in the layer of epoxy resin evaporates and exerts a pressure on the patterned printed wiring 6 from inside the layer.

The proper grain size of the copper powder 4 is between about 200 mesh and about 300 mesh. Copper powder of 200 mesh was used in the above embodiments. The supplier of the 200 mesh copper powder is Junsei Chemical Co., Ltd., Honcho, Nihonbashi, Chuo-ku, Tokyo, Japan.

In order to electrically interconnect the patterned printed wirings of separate layers, through-holes are made in the board and the insides of the through-holes are plated in a conventional manner.

A copper-clad glass epoxy resin board, which is readily available, may be utilized to form the first patterned printed wiring. A base board without a copper foil attached can alternatively be used. Such base board may be made of not only electrically insulating materials, such as glass, synthetic resin and wood, but also metals which are electrically conductive. Examples of the latter are a metal sheet and a chassis of an electrical or electronics device. If the base board is made of an electrically conductive material, the base board will first be covered with epoxy resin to form an insulating layer and the rest of the process for manufacturing a multilayer printed wiring board is performed in the same manner as described above.

In the above described embodiments, the entire area of the patterned printed wiring is covered by an adhesive epoxy resin layer. Whereas, when the adhesive epoxy resin is applied onto the surface by a screen printing method, predetermined sections of the surface may be masked so that the parts of the patterned printed wiring corresponding to the masked sections may be left exposed without being covered by the adhesive epoxy resin. Then, by copper-plating the entire surface after copper powder has been applied onto the surface and the epoxy resin has been cured, the copper foil newly plated on the top makes a direct connection to the parts of the printed wiring which have been left exposed. In this manner, predetermined sections of two or more layers of printed wirings can be electrically interconnected without copper-plated through-holes.

An example of the epoxy resin which can be used for the present invention is "Araldite", Product No. GY250, supplied by Japan Ciba-Geigy.

Although epoxy resin is used for the adhesive material in the above embodiments, a silicon-based adhesive may be substituted for epoxy resin as the adhesive material. Further, powders of nickel etc. may be substituted for copper powder used in the above embodiments for obtaining a similar strong bonding effect between a printed wiring and the corresponding insulating material.

As explained above in reference to the first and the second embodiments, since the epoxy resin insulation layer is covered with metal powder securely fixed to the surface of the layer and the metal powder is integrated into the copper plated on the layer, the copper foil, or consequently, the patterned printed wiring, is strongly bonded to the layer. Such strong bond eliminates the possibility of separation of the copper foil, or the patterned printed wiring, from the insulation layer. Thus, high precision, peel-free multilayer printed wiring boards can be produced easily, efficiently and economically.

While preferred embodiments of this invention have been disclosed hereinabove, those skilled in the art will appreciate that changes and modifications may be made therein without departing from the spirit and scope of this invention as defined in the appended claims.

What is claimed is:

1. A method of making an improved multilayer printed wiring board, comprising the steps of:
    (a) preparing a base printed wiring board having a base board and a first printed wiring, said first printed wiring being rigidly attached to a surface of said base board;
    (b) applying an insulation material onto said surface of said base board while said insulation material is uncured and adhesive so as to evenly cover said first printed wiring with said insulation material, whereby a layer of said insulation material is formed on said first printed wiring;
    (c) spreading metal powder consisting of fine grains evenly on said layer of said insulation material while said insulation material is uncured and adhesive in such a manner that little space is left among said fine grains of said metal powder, whereby said fine grains of said metal powder adhere to the surface of said layer of said insulation material;
    (d) curing said insulation material so that said metal powder is securely fixed to said layer of said insulation material, whereby a rigid layer of said metal powder is formed on said layer of said insulation material;
    (e) copper-plating said layer of metal powder so that a copper foil is formed on said layer of said insulation material, said fine grains of said metal powder acting as kernels for the copper plating and being integrated with said copper foil, whereby said copper foil is securely bonded to said layer of said insulation material; and
    (f) etching said copper foil according to a predetermined pattern to form a second printed wiring.

2. A method of making an improved multilayer printed wiring board, comprising the steps of:
    (a) preparing a base printed wiring board having a base board and a first printed wiring, said first printed wiring being rigidly attached to a surface of said base board;
    (b) applying a first lot of an insulation material onto said surface of said base board while said insulation material is uncured and adhesive so as to evenly cover said first printed wiring with said first lot of said insulation material, whereby a first coat of said insulation material is formed on said first printed wiring;
    (c) curing said first coat of said insulation material;
    (d) applying a second lot of said insulation material onto said first coat of said insulation material while said insulation material is uncured and adhesive so as to evenly cover said first coat of said insulation material, whereby a second coat of said insulation material is formed on said first coat of said insulation material;
    (e) evenly spreading metal powder consisting of fine grains on said second coat of said insulation material while said second coat of said insulation material is uncured and adhesive in such a manner that little space is left among said fine grains of said metal powder, whereby said fine grains of said metal powder adhere to said second coat of said insulation material;
    (f) curing said second coat of said insulation material so that said metal powder is securely fixed to said second coat of said insulation material, whereby a rigid layer of said metal powder is formed on said second coat of said insulation material;
    (g) copper-plating said layer of metal powder so that a copper foil is formed on said second coat of said insulation material, said fine grains of said metal powder acting as kernels for the copper plating and being integrated with said copper foil, whereby said copper foil is securely bonded to said second coat of said insulation material; and (h) etching said copper foil according to a predetermined pattern to form a second printed wiring.

3. A method of making an improved multilayer printed wiring board, comprising the steps of:

(a) preparing a base printed wiring board having a base board and a first printed wiring, said first printed wiring being rigidly attached to a surface of said base board;

(b) applying a first lot of an insulation material onto said surface of said base board while said insulation material is uncured and adhesive so as to evenly cover said first printed wiring with said first lot of said insulation material, whereby a first coat of said insulation material is formed on said first printed wiring;

(c) evenly spreading glass powder consisting of fine grains on said first coat of said insulation material while said first coat of said insulation material is uncured and adhesive in such a manner that little space is left among said fine grains of said glass powder, whereby said fine grains of said glass powder adhere to the surface of said first coat of said insulation material;

(d) curing said first coat of said insulation material so that said glass powder is securely fixed to the surface of said first coat of said insulation material, whereby a rigid layer of glass powder is formed on said first coat of said insulation material;

(e) applying a second lot of said insulation material onto said layer of glass powder while said insulation material is uncured and adhesive so as to evenly cover said layer of glass powder, whereby a second coat of insulation material is formed on said layer of glass powder and said layer of glass powder is sandwiched between said first coat of said insulation material and said second coat of said insulation material;

(f) evenly spreading metal powder consisting of fine grains on said second coat of said insulation material while said second lot of said insulation material is uncured and adhesive in such a manner that little space is left among said fine grains of said metal powder, whereby said fine grains of said metal powder adhere to the surface of said second coat of said insulation material;

(g) curing said second coat of said insulation material so that said metal powder is securely fixed to the surface of said second coat of said insulation material, whereby a rigid layer of said metal powder is formed on said second coat of said insulation material;

(h) copper-plating said layer of metal powder so that a copper foil is formed on said second coat of said insulation material, said fine grains of said metal powder acting as kernels for the copper plating and being integrated with said copper foil, whereby said copper foil is securely bonded to said second coat of said insulation material; and (i) etching said copper foil according to a predetermined pattern to form a second printed wiring.

4. A method of making an improved multilayer printed wiring board according to claim 1, wherein said metal powder is copper powder.

5. A method of making an improved multilayer printed wiring board according to claim 2, wherein said metal powder is copper powder.

6. A method of making an improved multilayer printed wiring board according to claims 3, wherein said metal powder is copper powder.

7. A method of making an improved multilayer printed wiring board according to claim 4, wherein said copper powder has a grain size between about 200 mesh and about 300 mesh.

8. A method of making an improved multilayer printed wiring board according to claim 5, wherein said copper powder has a grain size between about 200 mesh and about 300 mesh.

9. A method of making an improved multilayer printed wiring board according to claim 6, wherein said copper powder has a grain size between about 200 mesh and about 300 mesh.

10. A method of making an improved multilayer printed wiring board according to claim 1, wherein said insulation material is an epoxy resin.

11. A method of making an improved multilayer printed wiring board according to claim 2, wherein said insulation material is an epoxy resin.

12. A method of making an improved multilayer printed wiring board according to claim 3, wherein said insulation material is an epoxy resin.

* * * * *